United States Patent [19]

Emo

[11] 4,218,653
[45] Aug. 19, 1980

[54] CONNECTOR CONTACT CONTAMINATION PROBE

[75] Inventor: George C. Emo, Gahanna, Ohio

[73] Assignee: Bell Telephone Laboratories, Incorporated, Murray Hill, N.J.

[21] Appl. No.: 950,723

[22] Filed: Oct. 12, 1978

[51] Int. Cl.² .......................................... G01R 31/02
[52] U.S. Cl. .................................................. 324/421
[58] Field of Search .............. 324/62, 64, 65 P, 28 R, 324/28 CR, 158 P

[56] References Cited

U.S. PATENT DOCUMENTS

| | | | |
|---|---|---|---|
| 3,335,365 | 8/1967 | Libhart | 324/64 |
| 3,735,254 | 5/1973 | Severin | 324/64 |
| 3,974,443 | 8/1976 | Thomas | 324/64 |
| 3,996,514 | 12/1976 | Brown | 324/28 CR |
| 4,126,824 | 11/1978 | Thornburg | 324/62 |

OTHER PUBLICATIONS

J. Arnhart, R. Bove, IBM Technical Disclosure Bul. vol. 19, No. 12, pp. 4679, 4680.

Primary Examiner—Michael J. Tokar
Attorney, Agent, or Firm—Dwight A. Marshall

[57] ABSTRACT

Probe apparatus having a pair of folded electrodes is arranged for use in detecting and measuring contamination films and foreign material appearing on connector contact terminals. The probe apparatus (1) comprises an insulation support member (2) positioned between two dielectric elements (31, 41) each having a surface plated with electrically conducting elements (32, 42) joined at one end of the insulation member to form a folded electrode (33, 43) and left free at the other end to form two lead-in terminals (34, 35, 44, 45). The combined insulator support member and dielectric contact elements are mounted in a test head assembly so that operation of the test head assembly inserts the probe apparatus into a connector contact terminal to engage the two folded electrodes with the connector contact terminal. Electrical resistance measuring equipment coupled to the lead-in terminals measures the electrical resistance of contamination films and foreign material appearing on the connector contact terminal between the pair of folded electrodes.

8 Claims, 5 Drawing Figures

CONNECTOR CONTACT CONTAMINATION PROBE

TECHNICAL FIELD

This invention relates to apparatus for use in detecting connector contact terminal contamination. In particular, it relates to probe apparatus for use in detecting and measuring contamination films and foreign material that occur on the contact terminals of a connector.

BACKGROUND ART

Multicontact connectors have been widely used by the electrical and communications industry to interconnect circuit paths of component electrical circuits to form a larger composite electrical circuit. When component circuits are interconnected by connectors the composite circuit may fail to operate either from a failure of one of the component circuits or from a poor connection between contact terminals of the connector used to interconnect the circuit paths. The later type of circuit failure quite often results from a poor or the absence of a connection between mating connector contact terminals. This type of connector failure may arise either because some particulate matter or film formation has appeared on the contact surfaces of the connectors so that the contacts may fail to make electrical connection.

Often times during the manufacture of connectors a contamination film or foreign material inadvertently appears on ones of the contact terminals of connectors. Subsequently, the connectors are installed in or on electrical equipment to provide a means to interconnect component electrical circuits that may be added or installed after the electrical equipment has been shipped and located on customer premises. When electrical component circuits are later installed the contamination film and foreign material appearing on the contact terminals result in a poor electrical connection between mating connector contact terminals that cause failure of the composite electrical circuit. Locating this type of circuit failure is extremely difficult.

Measurement techniques and apparatus have been developed to measure the electrical resistance of conducting surfaces. These measurement techniques, sometimes referred to as a so-called four-point contact resistance measurement, are accomplished by applying a known constant current to two outer points of a contact area and measuring the voltage appearing between two inner points of the same contact area. The contact resistance may then be readily ascertained from the value of the known current and measured voltage. A problem with the apparatus used to make a four-point contact resistance measurement is that sufficient space must be available in order to gain access to the measurement points.

Apparatus has been disclosed for use with connectors to measure the resistance between printed patterns on a circuit board and the connector contact terminals. The prior art connector measuring apparatus comprises a pair of first probes for engaging a conducting finger pattern on the circuit board and a pair of second probes for engaging a contact terminal of the connector. Measurement of the contact resistance between the connector contact terminal and the circuit board conducting finger pattern is made by applying a known constant current between one of the first and second probes and determining the voltage between the other one of the first and second probes. The aforementioned problem is highlighted in that a difficulty with this type of apparatus is that the two pairs of probes are intended for use in measuring the contact resistance between a connector contact and the circuit board conducting finger pattern. A further difficulty occurs in this type of apparatus in that the probe apparatus intended for use with circuit board edge connectors is too bulky and cumbersome for use in detecting and measuring contamination films and foreign material on a contact terminal of a pin insertion type of connector.

Accordingly, a need exists in the art for probe apparatus arranged for use with measuring apparatus to detect and measure contamination films on connector contact terminals. A need also exists for probe apparatus arranged for use in detecting and measuring contamination films and foreign material that inadvertently occur on contact terminals during the manufacture of pin insertion type of connectors.

SUMMARY OF THE INVENTION

The foregoing problem is solved and a technical advance is achieved by probe apparatus having a pair of folded electrodes arranged for use in connecting electrical resistance measuring equipment to a contact terminal of a connector to detect and measure contamination films and foreign matter appearing on the surfaces of the contact terminal between the pair of folded electrodes. The probe apparatus comprises an insulating support member positioned between two dielectric members each having surfaces plated with electrical conducting elements joined at a tip end of the flexible dielectric member to form a folded electrode for engaging a connector contact terminal and left free at the other end to form two terminals for connecting the folded electrode to electrical resistance measuring equipment. The assembled insulating support and flexible dielectric members are mounted in a test head assembly so that operation of the test head assembly inserts the probe apparatus into the opening of a connector contact terminal to engage the two folded electrodes with the connector contact terminal. The four lead-in terminals enable the probe apparatus to be connected to electrical resistance measuring equipment so that the electrical resistance of contamination films and foreign matter appearing on the contact terminal may be measured between the two folded electrodes.

In accordance with the invention probe apparatus for use with test head apparatus to detect and measure contamination films and foreign matter on a connector contact terminal comprises an insulative support member having a rectangular body section with an elongated member extending from one end thereof. The probe apparatus also comprises contact apparatus having a pair of dielectric elements affixed to the support member wherein each dielectric element has a surface plated with electrical conducting elements joined at one end to form a folded electrode at the tip of the elongated member for engaging the connector contact terminal. The plated electrical conducting elements are left free at the other end to form two terminals for use in connecting the folded electrode to electrical resistance measuring equipment so that the electrical resistance of contamination films and foreign material appearing on the connector contact terminal may be measured between a pair of folded electrodes.

Also, in accordance with the invention, probe apparatus for use in detecting and measuring contamination films and foreign matter on a connector contact terminal comprises a substantially flat insulative material formed into a rectangular body member having an elongated member extending outwardly therefrom into a tip section sized for slidable insertion into the connector contact terminal. The probe apparatus also comprises contact apparatus having a pair of flexible dielectric elements each affixed respectively to an upper and lower surface of the insulative material and each having an upper surface plated with a pair of copper elements joined at one end to form a folded electrode at the tip section of the elongated member for engaging the connector contact terminal. The pair of copper and gold alloy elements are left free at the end of the rectangular body member opposite the elongated member tip section to form two terminals for coupling the folded electrode to electrical resistance measuring equipment.

In further accordance with the invention a test head assembly comprises a first bore extending from a front surface of the test head assembly toward a rear surface thereof and a second bore in axial alignment with the first bore and extending from the rear end of the first bore to the rear surface of the test head assembly for use in mounting probe apparatus arranged to detect and measure contamination films and foreign material on a connector contact terminal. The probe apparatus having a pair of folded electrodes affixed to an insulative support member is further comprised of a sleeve member having a flange section and a body section sized respectively for slidable insertion in the first and second bores of the test head assembly and is arranged to receive the support member and support the pair of folded electrodes in axial alignment therewith. The probe apparatus also comprises a compliant spring member having an inside diameter sized for slidably receiving the sleeve body section and an outside diameter sized for slidable insertion in the first bore of the test head assembly and is arranged to bias the sleeve member to maintain the pair of folded electrodes in engagement with the connector contact terminal.

DESCRIPTION OF THE DRAWING

The foregoing as well as other objects, features, and advantages of the invention will be more apparent from a description of the drawing in which.

DESCRIPTION OF THE INVENTION

1. Apparatus Description

Figure 1:
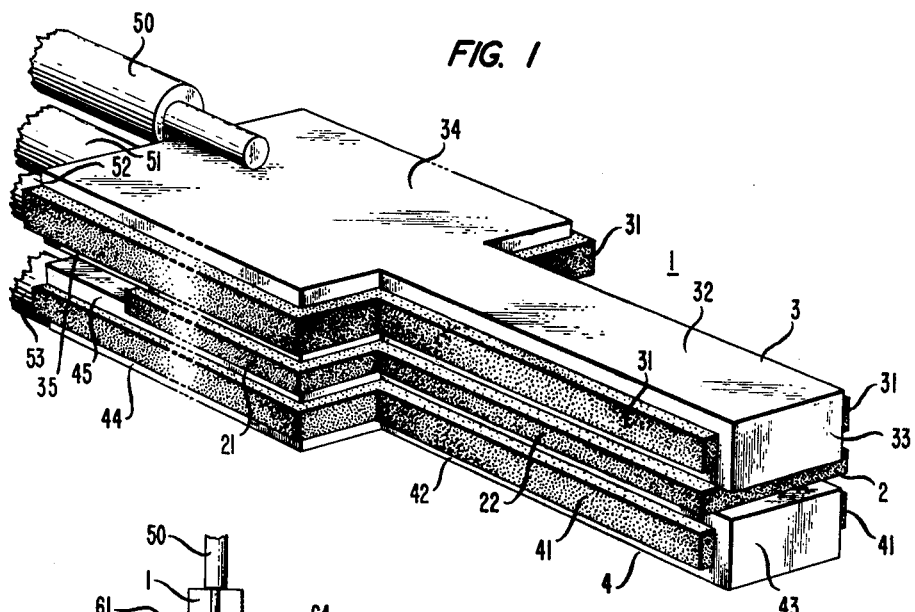
FIG. 1 is a fragmentary perspective view illustrating probe apparatus assembled in accordance with one embodiment of the invention.

Referring to the drawing and more specifically to FIG. 1 of the drawing, the probe apparatus set forth therein comprises a probe assembly 1 for use in detecting and measuring contamination films and foreign matter appearing on connector contact terminals. Probe assembly 1 includes a support member 2 of substantially flat insulative material formed into a rectangular body section 21 having an elongated member 22 extending outwardly from one end thereof. Typically, support member 2 is six mil (0.015 cm) thick electrical insulative material formed into a rectangular body section 21 having a length and width of approximately sixteen hundred mils (4.1 cm) and thirty-five mils (0.089 cm), respectively. Elongated member 22 extends outwardly from one end of rectangular body section 21 for a distance of four hundred mils (1 cm) and is approximately twenty mils in width (0.05 cm).

Support member 2 is positioned between contact apparatus intended for use in engaging the surfaces of a connector contact terminal. The contact apparatus comprises a pair of electrical contact assemblies 3 and 4 wherein each electrical contact assembly, for example contact assembly 3, is constructed of a flexible dielectric element 31 having an upper and lower surface plated with a suitable electrically conducting material such as a copper and gold alloy to form a conducting element 32. The electrically conducting material, hereinafter assumed to be a copper and gold alloy conducting element 32, is plated onto the upper and lower surfaces of flexible dielectric element 31 and joined at the end of elongated member 22 to form a folded electrode 33 having a thickness of approximately one mil (0.0025 cm). Each flexible dielectric element 31 and 41 extends beyond the rear portion of rectangular body section 21 so that the copper and gold alloy conducting elements 32 and 42 left free at the rear portion of flexible dielectric elements 31 and 41, respectively, form terminal surfaces 34, 35 and 44, 45 for terminating lead-in conductors 50, 51 and 52, 53.

Figure 2:
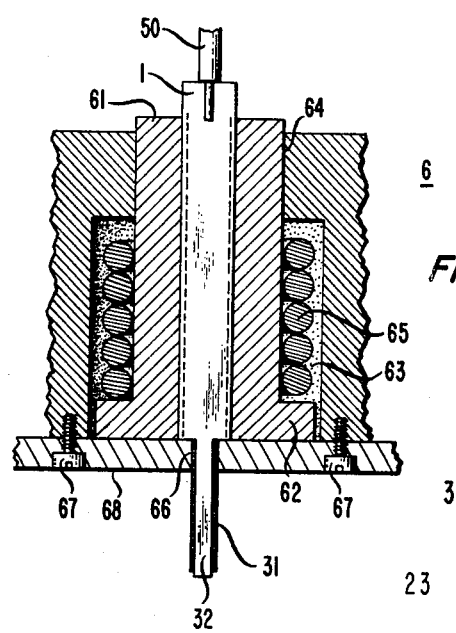
FIG. 2 is a fragmentary sectional top view illustrating the probe apparatus assembled in a connector contact terminal test head assembly.
Figure 3:
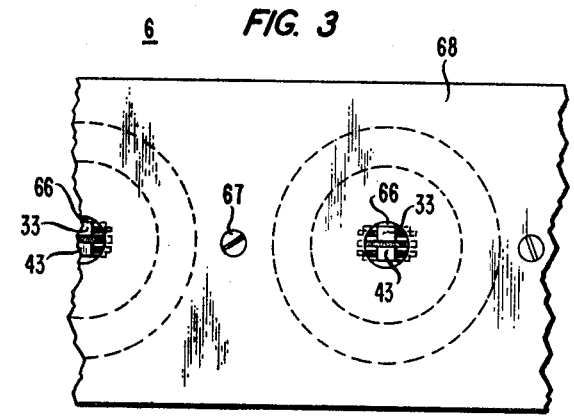
FIG. 3 is a frontal view of the probe apparatus mounted in the test head assembly.

Probe assembly 1 is intended for use with a test head assembly arranged for the production line testing of both single and multi row contact terminal connectors. Test head apparatus 6, of which only a fragmentary part is shown in FIGS. 2 and 3 of the drawing, is intended to hold a plurality of probe assemblies 1 in either a single or multi row configuration. Each probe assembly 1 is positioned along the center axis of a sleeve 61 formed of stainless steel or other similar material. Probe assembly 1 is positioned within sleeve 61 so that the elongated folded electrode portion thereof extends outwardly from flange section 62 of sleeve 61 and terminal assemblies 34, 35 and 44, 45 extend from the rear portion of sleeve 61 to form lead-in terminals for conductors 50, 51, 52 and 53.

Any one of a number of well-known ways may be used to position probe assembly 1 within sleeve 61. For example, a high temperature epoxy material may be used to hold and position probe assembly 1 within sleeve 61. In another example, sleeve 61 can be heated and the probe assembly 1 positioned therein so that subsequent cooling of sleeve 61 shrinks the sides thereof to maintain an interference fit with probe assembly 1. It is to be understood that other arrangements may advantageously be utilized to position probe assembly 1 within sleeve 61.

Test head apparatus 6, designed to hold a plurality of probe assemblies 1 in either a single or multi row configuration, is provided with a plurality of first bores 63 each sized to slidably receive flange section 62 of sleeve 61 and each extending from the front surface of test head apparatus 6 toward the rear surface thereof. A second bore 64 in alignment with first bore 63 and extending from the rear end of first bore 63 to the rear surface of test head assembly 6 is of a diameter sufficiently sized to slidably receive the body of sleeve 61.

In assembly a highly compliant spring member 65 having an inside diameter sized to receive the body of sleeve 61 and having an outside diameter sized for slidable insertion in first bore 63 is positioned over the body of sleeve 61. The assembled probe assembly 1, sleeve 61 and spring member 65 are positioned in test head apparatus 6 so that the body of sleeve 61 and the flange portion 62 thereof are slidably disposed in second bore 64 and first bore 63 respectively.

Test head apparatus 6 also includes a retaining plate 68 having a plurality of apertures 66 arranged in a single or multi row configuration. Each aperture 66 is sized to slidably receive the elongated folded electrode portion of probe assembly 1 and is spaced apart from each adjacent aperture a distance sufficient to enable the elongated folded electrode portion of probe assemblies 1 to be inserted in adjacent contact terminals of a connector. Assembly is completed by fitting apertures 66 of retaining plate 68 over the elongated folded electrode portion of probe assemblies 1 and fastening retaining plate 68 to the test head assembly by screws 67.

As set forth in FIG. 3 of the drawing, the folded electrode portion of probe assemblies 1 extends vertically outward from the front of the assembled test head apparatus. Positioning of test head assembly 6 with respect to a connector enables test head assembly 6 to be used to simultaneously engage the folded electrode portion of probe assemblies 1 with all the contact terminals of a connector. Probe assembly 1 retained by plate member 68 and biased by spring member 65 moves with respect to test head assembly 6 so that the folded electrodes 33, 43 lightly engage the connector contact terminal to detect any contamination films or foreign material that may be present on the surfaces of the contact terminal. Conductors, such as conductor 50 extending from the rear of test head assembly 6, FIG. 2 of the drawing, enable the pair of folded electrodes 33, 43 to be coupled to electrical resistance measuring apparatus.

Figure 4:
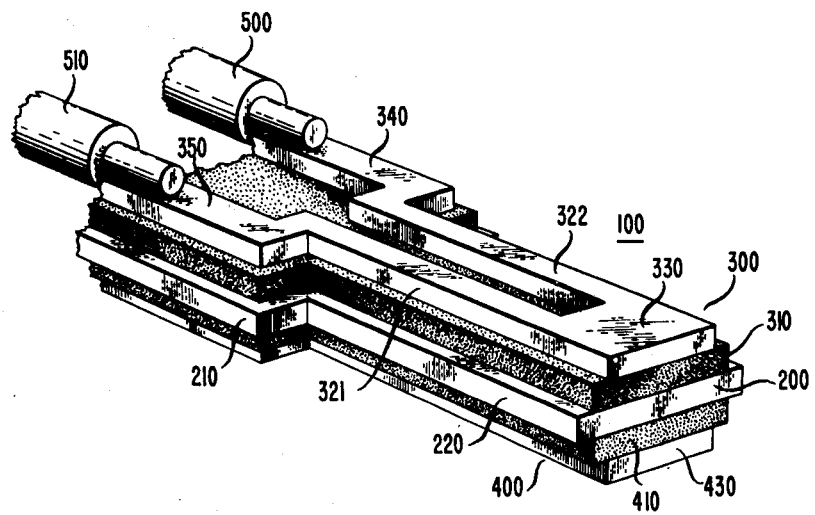
FIG. 4 is a fragmentary perspective view illustrating probe apparatus assembled in accordance with another embodiment of the invention.

Another embodiment of a probe assembly incorporating the principles of the present invention is set forth in FIG. 4 of the drawing. The probe assembly 1 therein designated as probe assembly 100, includes a substantially flat insulative support member 200 formed, as herein before described, into a rectangular body section 210 having an elongated member 220 extending outwardly from one end thereof. Support member 200 is positioned between two electrical contact assemblies 300 and 400 each constructed of a flexible dielectric element 310, 410 that is attached to one side of support member 200. Each dielectric element, for example assembled dielectric element 310, is plated with an electrically conducting material such as a copper and gold alloy to form a pair of electrical conducting elements 321 and 322. Conducting elements 321 and 322 are joined together at the tip end of elongated member 220 to form a folded electrode 330 and are left free at the other end of rectangular body section 210 to form lead-in terminals 340, 350 for conductors 500 and 510. Similarly, electrode 421 and electrode 422, not shown, are plated on dielectric element 410 to form a second folded electrode 430 that is coupled to a pair of conductors 520 and 523, not shown.

2. Operation

Figure 5:
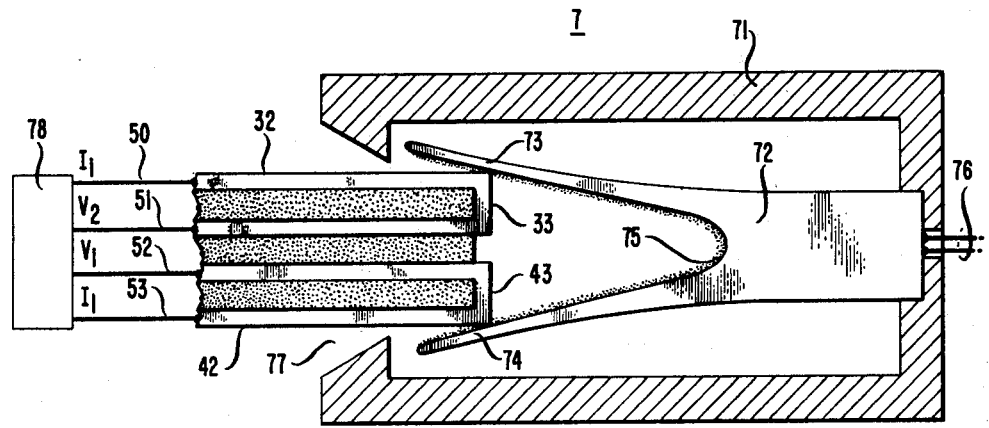
FIG. 5 is a partial side view illustrating the probe apparatus in engagement with a contamination film appearing on a connector contact terminal.

Referring to FIG. 5 of the drawing, connector 7 comprises a connector housing 71 having a plurality of female contact terminals 72 located therein. Each female contact terminal 72 has a pair of contact tines 73, 74 that are normally arranged to receive a male contact pin terminal and make contact therewith to establish an electrical connection from the male contact pin terminal through connector contact terminal 72 and over contact terminal tail 76 to an external electrical circuit.

Sometimes during the manufacture of connector 7 a contamination film 75 or foreign material inadvertently appears on contact tines 73, 74 of various ones of the connector contact terminals 72. The contamination film 75 results in a high electrical resistance condition appearing between the male contact terminal pin and contact terminal 72 that subsequently results in the failure of electrical circuits connected together through connector 7.

Test head assembly 6 is used during the manufacture of connector 7 to detect for the presence of contamination film 75 by simultaneously inserting a probe assembly 1 into the contact openings 77 of connector 7. The elongated folded electrode portion of each probe assembly 1 is inserted into the connector contact opening 77 until the pair of folded electron elements 33 and 43 are in contact with the contamination film 75 appearing on contact terminal tines 73, 74. High compliant spring member 65 enables probe assembly 1 to retract sufficiently so that the contamination film 75 is between folded electrode elements 33, 43 and contact tines 73, 74.

Resistant measuring apparatus 78 coupled to folded electrodes 33, 43 applies a constant current $I_1$ to contact terminal 72 over a path comprising conductor 50, conducting element 32, contamination film 75, contact terminal tines 73, 74, conducting element 42, and connector 53. The voltage drop caused by current $I_1$ flowing through the highly resistive contamination film 75 and appearing across the pair of folded electrodes 33, 43 of probe assembly 1 is measured by electrical measuring equipment over conductors 51, 52 and conducting elements 32, 42. The known value of current applied by probe assembly 1 to contact terminal 72 and the measured value of the voltage appearing across probe conductors 51, 52 provide an indication of the presence of a contamination film 75, or foreign matter, appearing on connector contact terminals 72.

SUMMARY

It is obvious from the foregoing that the facility, economy, and efficiency of determining connector contact terminal contamination may be substantially enhanced by probe apparatus arranged to engage a connector contact terminal and detect contamination films and foreign material appearing thereon.

It is further obvious from the foregoing that a probe assembly provided with a pair of folded electrodes arranged to engage a connector contact terminal and couple leads therewith to detect the presence of and measure a contamination film appearing on the connector contact terminal alleviates the need to design extra space within a connector so that bulky and cumbersome resistance measuring equipment could be used to measure connector contact terminal contamination.

What is claimed is:

1. Apparatus for use with electrical resistance measuring equipment (78) to detect and measure contamination of a contact terminal (72) of a connector (7) having
   a test head assembly (6) for use in testing the connector, and
   probe apparatus (1) positioned in said test head assembly for use in coupling the connector contact terminal to the electrical resistance measuring equipment,
   characterized in that
   said probe apparatus comprises
   an insulative support member (2) having a rectangular body section (21) with an elongated member (22) extending from end thereof, and
   contact apparatus (3, 4) having a pair of dielectric elements (31, 41) affixed to said support member and each having a surface plated with electrical conducting elements (32, 42) joined at one end to form a folded electrode (33, 43) at the tip of said elongated member for engaging the connector contact terminal and free at the other end to form two terminals (34, 35, 44, 45) for connecting said folded electrode to the resistance measuring equipment.

2. The connector contact terminal contamination detecting and measuring apparatus of claim 1
   characterized in that
   said support member comprises
   a substantially flat insulative material (2) formed into a rectangular body member (21) having an elongated member (22) extending outwardly therefrom into a tip section sized for slidable insertion into the connector contact terminal.

3. The connector contact terminal contamination detecting and measuring apparatus of claim 2
   characterized in that
   said contact apparatus comprises
   a pair of flexible dielectric elements (31, 41) each affixed respectively to an upper and lower surface of said support member and each having an upper and lower surface plated with a copper and gold alloy element (32, 42) joined at one end to form said folded electrode (33, 43) at said elongated member tip section and left free adjacent the end of said rectangular body member opposite said tip section to form said two terminals (34, 35, 44, 45).

4. The connector contact terminal contamination detecting and measuring apparatus of claim 2
   characterized in that
   said contact apparatus comprises
   a pair of flexible dielectric elements (310, 410) each affixed respectively to an upper and lower surface of said support member (200) and each having an upper surface plated with a pair of copper and gold alloy elements (321, 322, 421, 422) joined at one end to form said folded electrode (330, 430) at said elongated member (220) tip section and left free at the end of said rectangular body member (210) opposite said elongated member tip section to form said two terminals (340, 350, 440, 450).

5. The connector contact terminal contamination detecting and measuring apparatus of claim 2
   characterized in that
   said test head assembly comprises
   a first bore (63) extending from a front surface of the test head assembly toward a rear surface thereof and a second bore (64) in axial alignment with said first bore and extending from a rear end of said first bore to the rear surface of said test head assembly, and
   said probe apparatus comprises
   a sleeve member (61) having an inside diameter sized to slidably receive said rectangular body member and support the elongated member tip section in axial alignment therewith, said sleeve member having a body section sized for slidable insertion in said second bore and a flange section (62) sized for slidable insertion in said first bore of said test head assembly, and
   a compliant spring member (65) having an inside diameter sized for slidably receiving said sleeve member body section and an outside diameter sized for slidable insertion in said first bore for biasing said folded electrodes in engagement with the connector contact terminal.

6. The connector contact terminal contamination detecting and measuring apparatus of claim 5
   characterized in that
   said test head assembly further comprises
   a plate member (68) having an aperture (66) for slidably supporting said elongated member and for retaining said sleeve flange section within said first bore.

7. Apparatus for use with electrical resistance measuring equipment (78) to detect and measure contamination films and foreign material on a contact terminal (72) of a connector (7) having
   a test head assembly (6) for use in testing the connector, and
   probe apparatus (1) positioned in said test head assembly (6) for use in coupling the connector contact terminal to the electrical measuring resistance equipment,
   characterized in that
   said probe apparatus comprises
   a support member (2) of substantially flat insulative material having a rectangular body section (21) and an elongated member (22) extending from an end of said rectangular body section,
   contact apparatus (3, 4) for electrically contacting the connector contact terminal, said contact apparatus having a pair of flexible dielectric elements (31, 41) each affixed to a surface of said support member and each having a surface plated with a copper and gold alloy (32, 42) joined at one end to form a folded electrode (33, 43) at a tip end of said elongated member and free at the other end to form two lead-in terminals (34, 35, 44, 45) for connection with the electrical resistance measuring equipment, and
   support apparatus (61, 65, 68) for positioning and retaining said support member and said contact apparatus in the test head assembly to enable said contact apparatus to engage said folded electrodes with the connector contact terminal to detect and measure resistance of a contamination film and foreign material appearing on the connector contact terminal between said folded electrodes.

8. Apparatus for use with electrical resistance measuring equipment (78) to detect and measure contamination films and foreign material on a pin insertion contact terminal (72) of a connector (7) having
   a test head assembly (6) for use in testing the connector, and
   probe apparatus (1) positioned in said test head assembly for use in coupling the pin insertion connector contact terminal to the electrical resistance measuring equipment, characterized in that said test head assembly also comprises a first bore (63) extending from a front surface of the test head assembly toward a rear surface thereof and a second bore (64) in axial alignment with said first bore and extending from a rear end of said first bore to the rear surface of said test head assembly, said first and said second bores sized to slidably receive said probe apparatus, said probe apparatus comprises a support member (1) of substantially flat insulative material having a rectangular body member (21) and an elongated member (22) extending therefrom into a tip section sized for slidable insertion into the connector pin insertion contact terminal, contact apparatus (3, 4) for electrically contacting the connector pin insertion contact terminal, said contact apparatus having a pair of flexible dielectric elements (31, 41) each affixed respectively to an upper and lower surface of said support member and each having an upper and lower surface plated with a copper and gold alloy element (32, 42) joined at one end to form a folded electrode (33, 43) at the tip section of said elongated member and free at the other end of said rectangular body member to form two terminals (34, 35, 44, 45) for connection with the electrical resistance measuring equipment, a sleeve member (61) having an inside diameter sized to receive said rectangular body member and support the elongated member tip section in axial alignment therewith, said sleeve member having a body section sized for slidable insertion in said second bore and a flange section sized for slidable insertion in said first bore of said test head assembly, and a compliant spring member (65) having an inside diameter sized for slidably receiving said sleeve member body section and an outside diameter sized for slidable insertion in said first bore for biasing said sleeve flange section to maintain said folded electrodes in engagement with said connector pin insertion contact terminal, and said test head assembly further comprises a plate member (68) having an aperture (66) for slidably supporting said elongated member and for retaining said sleeve flange section within said first bore, and a pair of electrical conductors (50, 51, 52, 53) for coupling said lead-in terminals to said electrical resistance measuring equipment.

* * * * *